United States Patent [19]

Zimmer

[11] Patent Number: 4,918,277
[45] Date of Patent: Apr. 17, 1990

[54] HEATED TOOL WITH NON-FLAT HEATING SURFACE FOR AVOIDING SOLDER-BRIDGING

[75] Inventor: Gero Zimmer, Munich, Fed. Rep. of Germany

[73] Assignee: Productech Inc., Rolling Hills Estates, Calif.

[21] Appl. No.: 215,628

[22] Filed: Jul. 6, 1988

[30] Foreign Application Priority Data

Jul. 9, 1987 [DE] Fed. Rep. of Germany ....... 3722725

[51] Int. Cl.$^4$ ............................ H05B 1/00; B23K 1/12
[52] U.S. Cl. ................................ 219/56.1; 219/85.16; 219/85.18; 228/180.2; 228/215
[58] Field of Search ...................... 219/56, 56.1, 56.21, 219/56.22, 85 D, 85 F, 85 R, 243, 85.1, 85.16, 85.18; 228/51, 54, 180.2, 215

[56] References Cited

U.S. PATENT DOCUMENTS 4,090,656 5/1978 Sato et al. ........................ 228/180.1
4,220,845 9/1980 Morreale ............................. 219/243

Primary Examiner—Derek S. Jennings
Assistant Examiner—David Osborn
Attorney, Agent, or Firm—Notaro & Michalos

[57] ABSTRACT

A heated tool for soldering objects to a plurality of pads which are spaced apart by a selected pitch, comprises a tool member having a heating surface with a plurality of spacer bars thereon, spaced by the pitch between the pads. The spacer bars act to separate one pad from the other to avoid the flow of solder between the pads.

21 Claims, 4 Drawing Sheets

HEATED TOOL WITH NON-FLAT HEATING SURFACE FOR AVOIDING SOLDER-BRIDGING

FIELD AND BACKGROUND OF THE INVENTION

The present invention relates in general to heated tools, and in particular to a new and useful heated tool for soldering objects to a plurality of pads which are spaced apart by a certain spacing, the heated tool including spacer bars for isolating the pads from each other. The heating tools may either be moved to the objects to be treated or connected, or mounted in a fixed position with the object to be treated or connected being brought to the heated tool.

Thermal energy is either supplied to the objects to be treated or connected, by radiant heating from heated surfaces of the tool, or by direct thermal contact between the heated tool and the object. A controlled force is usually applied against the object by the heated tool. An additional thermal conductive material may be used to increase heat flow from the heated tool to the object. Flux, for example, may be provided for increasing the transfer of heat and for reducing oxidation during the thermal process.

Such tools may supply heat either continuously or during selected time periods only. Heat may be applied during heating pulses which may be activated or controlled by various external conditions, for example, by forcing the heated tool against the object to be heated or connected.

Various sources of heat are known for heating the heated tool to a variety of selected temperatures. Hot gases and/or electric current for example may be used for heating specified heat supplying areas or surfaces of the tool.

For the present invention, it is preferable to utilize the flow of electrical current through a heated tool for heating the tool. This permits controlled pulse-heating featuring fast heating rates as well as precise temperature control at various areas of the tool.

A known generally U-shaped heated tool is disclosed in German Pat. reference No. 2,848,519. This heated tool is mounted to holders either using screws or by welding. This keeps the heat supplying areas of the tool in position and further is used to provide electrical connectors for feeding electrical heating current to the tool. Such tools can be manufactured using sheet metal designs (see German Pat. Nos. 3,144,048.7, 3,137,859.5 and 3,137,860.9 to the present inventor). These heated tools can also be machined from solid materials.

When transferring thermal energy to one or more objects using one or more heated tools, excess heat and relatively long periods of time are sometimes needed, particularly when the objects are made of materials having high thermal loads.

The use of force-controlled thermal contact for transferring thermal energy from a tool to a part must also be accurately controlled. For this reason force-controlled thermal contact has limited applications. Objects having high thermal conductivity, for example objects made of metal oxides, require different procedures. Continuous preheating for example may be necessary for such applications. A heating tool is simply set at a much higher temperature to compensate for thermal loads. This has limitation however in that excess heat may be damaging to some materials.

SUMMARY OF THE INVENTION

An object of the present invention is to provide a heated tool which can join two or more parts together by thermal treatment and which can reduce or illiminate solder-bridging of parts or areas which are located close to each other. Usually, the parts of electric components which are to be joined by solder or similar materials, can be positioned to within only certain spacings from each other. Closer spacings cannot be utilized since solder may flow between the parts causing undesirable bridging and short circuits. This occurs when conventional heated tools having flat heating surfaces are utilized.

Another object of the present invention is to provide spacer bars on the heating surface of the heated tool which are shaped to match or compliment the spacing between the parts that are to be soldered or otherwise heat treated. This prevents the undesirable flow of solder from one part to the other during the heating cycle.

In accordance with the invention, the spacer bars can be formed as one piece with the heated tools or can be added on as additional structures onto the heating surface of the heated tools. In this way the spacer bars can be made of materials having different properties than the material of the heating surface. Materials having different thermal properites (such as low conductivity) or wetting capabilities can be used. Lower temperatures can thus be supplied to areas between the parts that are to be soldered, to reduce the flow of heat to these areas. By selecting wetting properties, the flow of solder to the areas between the parts can also be reduced.

Spacer bars with special shapes and special thermal properties can thus be provided on the heated tool. Higher or lower temperatures can be provided across the heated tool and its spacer bars to advantageously and closely control the flow of solder.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF EMBODIMENTS

Figure 1:
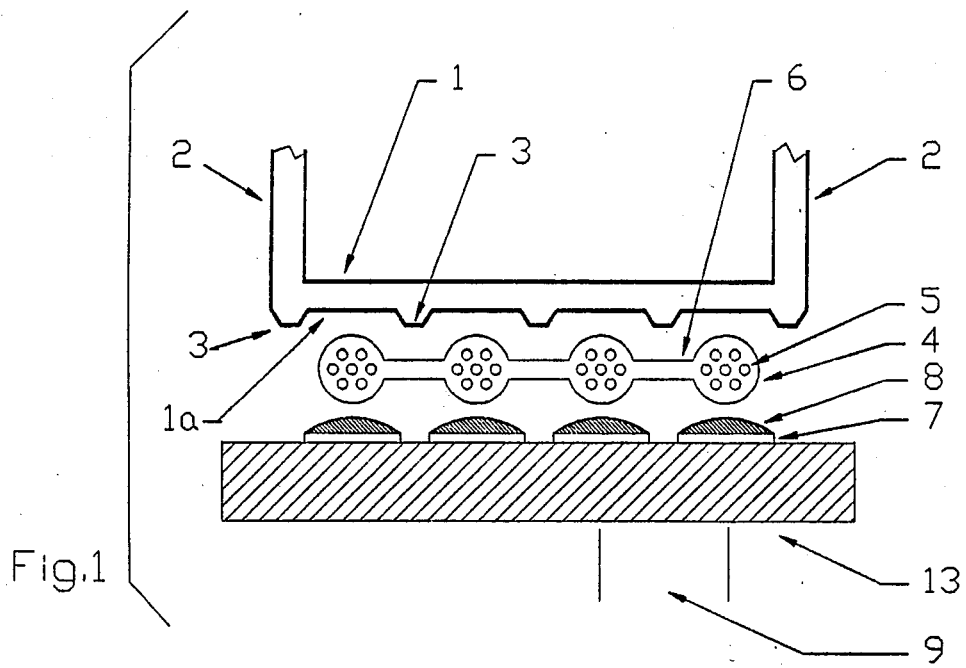
FIG. 1 is a fragmentary side elevational view of a heated tool in accordance with the present invention for connecting a flat cable having four wire or wire bundles to four pads of a circuit board or substrate.

Referring to the drawings in particular, the invention embodied in FIG. 1 comprises a heated tool 1 having a non-flat heating surface 1a which is provided with a plurality of spacer bars 3. Electrical current and pressure is supplied to the heating surface 1a by a pair of connector bars 2, 2.

The heated tool is particularly useful for connecting an insulated flat cable 4 having a plurality of wire or wire bundles 5 that are spaced from each other by an insulated web 6, to connector pads 7 which are spaced apart by a pitch 9 on the surface of a substrate or a circuit board 13. Each pad 7 is provided with a coating of solder 8 for connecting the wires 5 to the pads 7.

Figure 4:
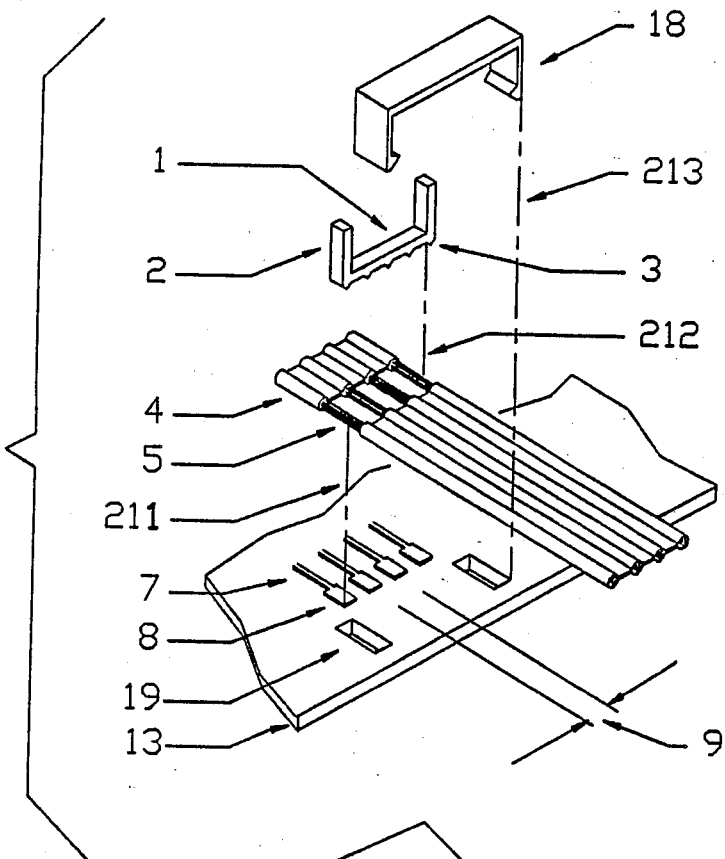
FIG. 4 is a perspective view showing the manner of connection to a circuit board in accordance with the invention.

As also shown in FIG. 4, a section of cable 4 which is to be connected to pads 7 is stripped and rendered free of insulation to expose the wires 5.

Figure 2:
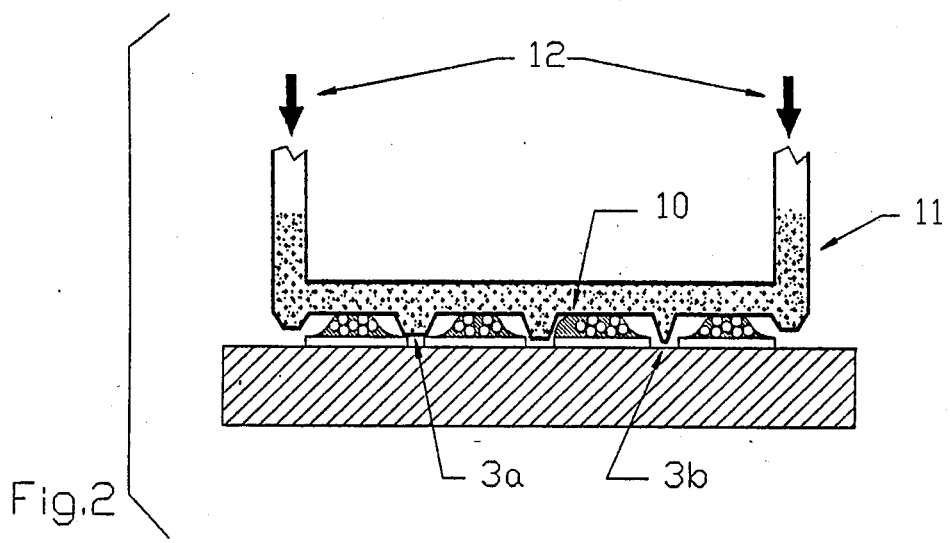
FIG. 2 view similar to FIG. 1 showing a further embodiment of the invention having differently shaped spacer bars.

As shown in FIG. 2, to heat treat or solder the pads 7 to the wires 5 tool is heated in its heating area, as schematically illustrated by crosses 11 and brought down under pressure in the direction of arrows 12 onto the wires 5. The heating causes the solder to melt. Because of the existence of spacer bars on the heating surface, the solder is precluded from flowing from one pad to the other. The flowing solder is blocked and dammed by the spacer bars as shown at 10.

FIG. 2 also illustrates that the spacer bars can be differently shaped. Spacer bar 3a can, for example, be broader than the space between the pads and narrow in the vertical direction so that a solder connection is made without contacting the spacer bar 3a with the top surface of the pads. Alternatively, the spacer bar 3b can be narrow and deep to engage fully between the pads.

In accordance with the present invention, a pitch 9 of 1.27 mm or less can be achieved. This corresponds to an equally small pitch for the wires 5 in the cable 4. As noted above, this is achieved without the danger of solder bridging between adjacent pads.

Figure 3A:
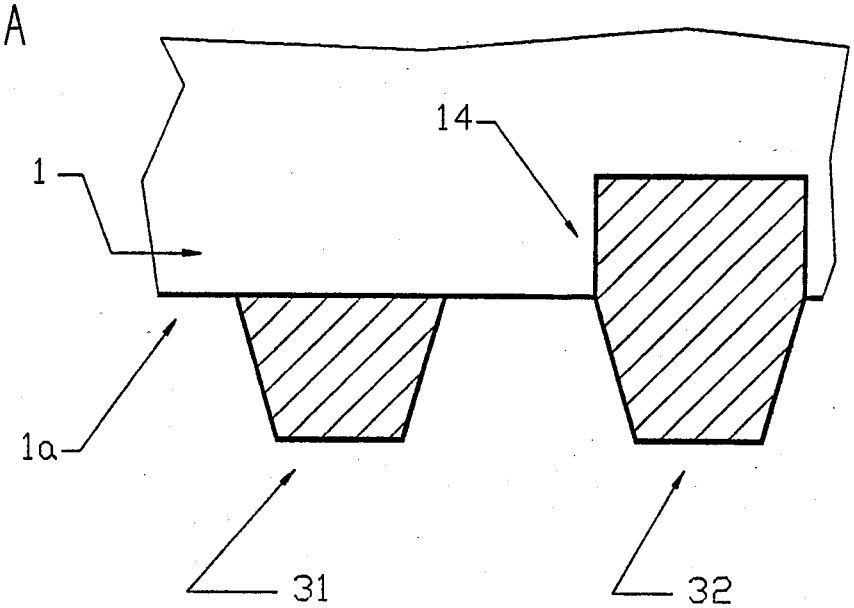
FIG. 3A is iew similar to FIG. 3 of an embodiment of the invention wherein the spacer bars are made as separate pieces from the heating surface of the tool.
Figure 3:
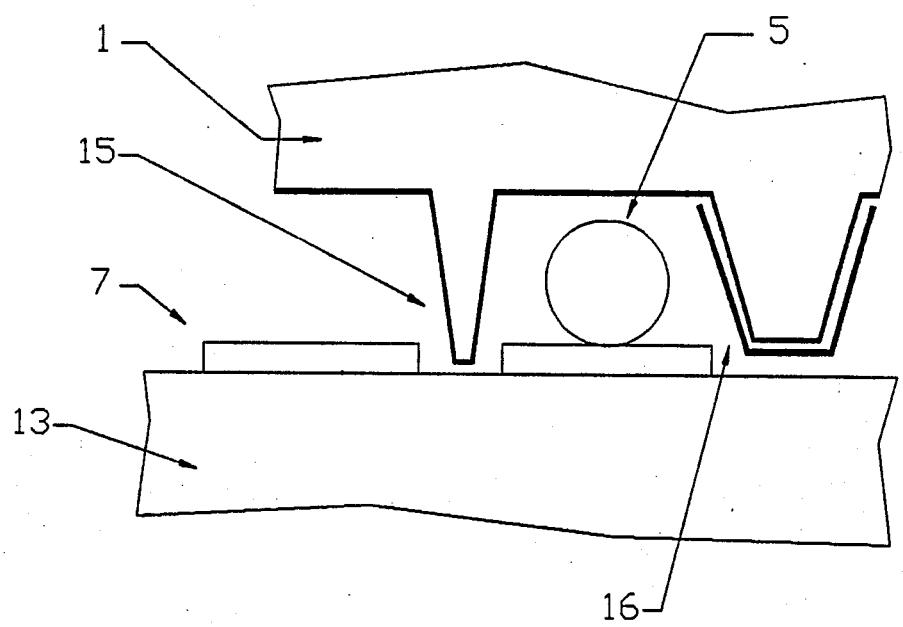
FIG. 3 is a fragmentary enlarged cross-sectional view of an area of tool having differently shaped spacer bars made as one piece with the heating surface of the tool.

FIG. 3 illustrates an embodiment of the invention where one of the spacer bars is provided with a plating or coating of material 16. Material 16 can be selected to have certain advantageous properties. For example, a material having low thermal conductivity can be selected for decreasing the amount of heat transferred to the areas between the pads. Alternatively, the material can have a higher thermal conductivity for increasing the amount of heat provided between the pads.

Spacer bar 15 of the long narrow type may also be utilized for almost touching the board 13 to physically separate the pads from each other. FIG. 3 shows the example of the invention wherein the spacer bars are made as one piece with the heated tool.

The embodiment shown in FIG. 3A includes a spacer bar 31 which is connected to an otherwise flat heating surface 1a, for example by welding. Another spacer bar 32 can be connected into a slot 14 provided in heating surface 1a.

By making the spacer bars 31, 32 as separate units from the rest of the heated tool, the materials of the spacer bars can be selected for desirable properties such as heat transmission or wetting. Material which has low wetting affinity for solder may be desirable to avoid the flow of solder between the space between pads.

FIG. 4 shows a manner of assembling and connecting the cable 4 to a circuit board 13 which is provided with holes 19 for receiving the arms of a cable clamp 18.

In operation, cable 4 with areas of wires 5 stripped, is brought down in the direction of arrow 211 onto pads 7 which are precoated with solder 8. The heated tool 1 is then brought down onto the wires and pads in the direction of arrow 212 and supplied with electrical current sufficient to melt the solder. Spacer bars 3 prevent flow of solder between pads.

The heated tool 1 is then removed and the solder solidifies. Clamp 18 is then brought down in the direction arrow 213 into holes 19 to firmly clamp cable 4 to circuit board 13.

Figure 5:
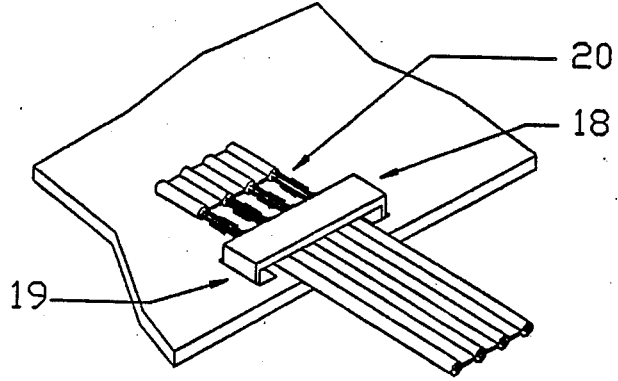
FIG. 5 is the assembled cable connection.

FIG. 5 shows the assembled connection.

Figure 6A:
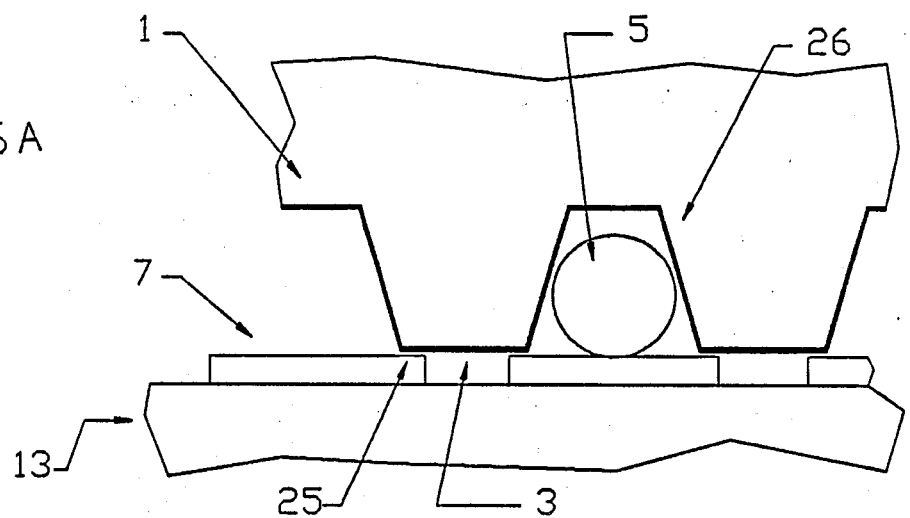
FIG. 6A is a view similar to FIG. 6 of a still further embodiment of invention.
Figure 6:
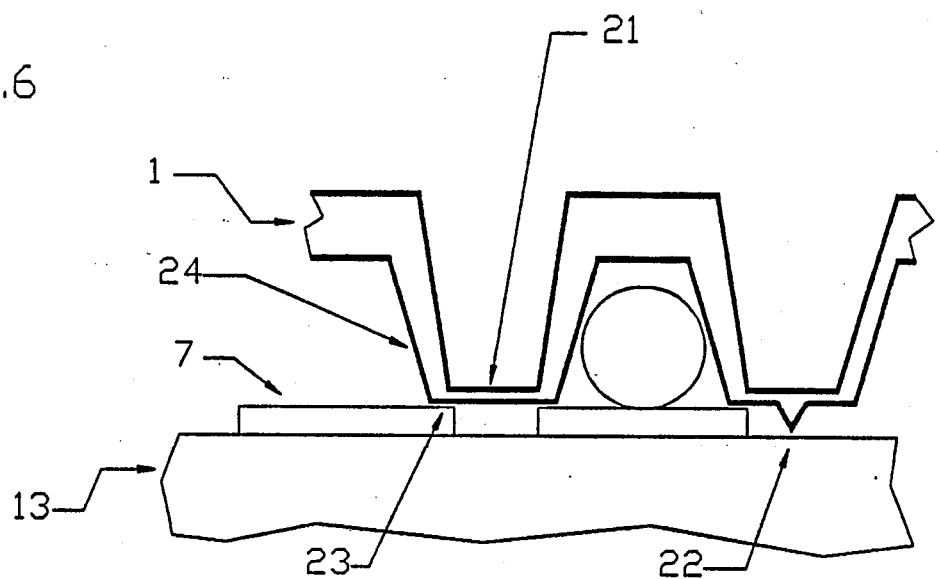
FIG. 6 is a fragmentary side elevational view of a further embodiment of wherein the cross-sectional shape of the heated can be selected for controlling the amount of heat being supplied to various areas.

FIG. 6 shows another embodiment of the invention wherein the heated tool 1 has a non-flat configuration with areas having different cross sections. A lower cross section increases the resistance to electricity and would increase the temperature of the heated tool in this area. For example, small cross sectioned area 21 can be provided at the spacer bar and can be dimensioned to contact the surface of adjacent pads at 23. This helps transfer heat directly to the pads thus improving and increase the rate at which the solder melts and the connection is made. To help isolate the pads from each other, an additional projection 22 may be provided at the bottom of the spacer bar 21.

FIG. 6A shows a version of the invention wherein each of the spacer bars is solid and touches adjacent pads at 25. Again, heat is transferred to the pads, but less heat is provided since the spacer bars have a greater cross section than the remainder of the heated tool.

While specific embodiments of the invention have been shown and described in detail to illustrate the application of the principles of the invention, it will be understood that the invention may be embodied otherwise without departing from such principles.

What is claimed is:

1. A heated tool for connecting objects to a plurality of pads which are spaced from each other by a certain distance, comprising a tool member having a heated bar with a heating surface for each pad and at least one spacer bar connected to said tool member and disposed between said heating surfaces for isolating an object on one pad from an object on another pad, said tool member having different cross-sectional areas at said heating surface and said spacer bar for providing different amounts of heat, each spacer bar having a width selected to be at least greater than the certain distance between the pads for directly contacting the pads to transfer heat to the pads for connecting the objects to the pads.

2. A heated tool according to claim 1 wherein the spacer bar is made as one piece with the tool member and heating surface.

3. A heated tool according to claim 1 wherein said spacer bar is made as separate parts from said tool member, and is connected to said tool member adjacent said heating surface.

4. A heated tool according to claim 1 wherein said spacer bar is coated with a material which is different from that of said tool member.

5. A heated tool according to claim 4 wherein said material coating has a low wetting affinity for solder.

6. A heated tool according to claim 1 including defining a plurality of spacer bars by cutting slots into the tool member to also form said heating surfaces.

7. A heated tool for connecting objects to a plurality of pads which are spaced from each other by a certain distance, comprising a tool member having a heating bar with a heating surface for each pad and at least one spacer bar connected to said tool member and disposed between said heating surfaces for isolating an object on one pad from an object on another pad, and a projection extending from spacer bar.

8. A heated tool according to claim 7 including a plurality of spacer bars, said heating surface with said spacer bars being non-flat, said spacer bars being spaced from each other by about the certain distance between the pads.

9. A heated tool according to claim 7 wherein the spacer bar is made from as one piece with the tool member and heating surface.

10. A heated tool according to claim 7 wherein said spacer bar is made as separate parts from said tool member, and is connected to said tool member adjacent said heating surface.

11. A heated tool according to claim 7 wherein said spacer bar is coated with a material which is different from that of said tool member.

12. A heated tool according to claim 11 wherein said material coating has a low wetting affinity for solder.

13. A heated tool according to claim 7 including defining a plurality of spacer bars by cutting slots into the tool member to also form said heating surfaces.

14. A heated tool according to claim 7 wherein each spacer bar has a width selected to be at least greater than the certain distance between the pads for directly contacting the pads to transfer heat to the pads for connecting the objects to the pads.

15. A heated tool for connecting objects to a plurality of pads which are spaced from each other by a certain distance, comprising a tool member having a heating bar with a heating surface for each pad and at least one spacer bar connected to said tool member and disposed between said heating surfaces for isolating an object on one pad from an object on another pad, said spacer bar being narrower than the distance between the pads for engaging between the pads when said tool member is brought close to the pads for connecting the objects to the pads.

16. A heated tool according to claim 15 including a plurality of spacer bars, said heating surface with said spacer bars being non-flat, said spacer bars being spaced from each other by about the certain distance between the pads.

17. A heated tool according to claim 15 wherein the spacer bar is made from as one piece with the tool member and heating surface.

18. A heated tool according to claim 15 wherein said spacer bar is made as separate parts from said tool member, and is connected to said tool member adjacent said heating surface.

19. A heated tool according to claim 15 wherein said spacer bar is coated with a material which is different from that of said tool member.

20. A heated tool according to claim 19 wherein said material coating has a low wetting affinity for solder.

21. A heated tool according to claim 15 including defining a plurality of spacer bars by cutting slots into the tool member to also form said heating surfaces.

* * * * *